United States Patent
Wang et al.

(10) Patent No.: US 7,116,034 B2
(45) Date of Patent: Oct. 3, 2006

(54) STRUCTURE TO ACHIEVE HIGH-Q AND LOW INSERTION LOSS FILM BULK ACOUSTIC RESONATORS

(75) Inventors: Li-Peng Wang, Santa Clara, CA (US); Oing Ma, San Jose, CA (US); Valluri Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 3 days.

(21) Appl. No.: 11/065,511

(22) Filed: Feb. 23, 2005

(65) Prior Publication Data

US 2005/0140246 A1    Jun. 30, 2005

Related U.S. Application Data

(62) Division of application No. 10/716,750, filed on Nov. 19, 2003, now Pat. No. 6,861,783, which is a division of application No. 10/023,594, filed on Dec. 17, 2001, now Pat. No. 6,662,419.

(51) Int. Cl.
*H01L 41/08* (2006.01)
*H03H 9/02* (2006.01)

(52) U.S. Cl. .................. 310/320; 310/324; 310/365; 333/187

(58) Field of Classification Search ............. 310/311, 310/324, 328, 365; 333/187, 193
See application file for complete search history.

(56) References Cited

U.S. PATENT DOCUMENTS

| | | | |
|---|---|---|---|
| 5,233,259 A * | 8/1993 | Krishnaswamy et al. ... | 310/324 |
| 5,395,641 A | 3/1995 | Shibata et al. | |
| 5,747,857 A | 5/1998 | Eda et al. | |
| 5,884,378 A | 3/1999 | Dydyk | |
| 5,935,641 A * | 8/1999 | Beam et al. ................ | 427/100 |
| 6,259,187 B1 * | 7/2001 | Abe et al. ................... | 310/320 |
| 6,349,454 B1 | 2/2002 | Manfra et al. | |
| 6,456,173 B1 * | 9/2002 | Ella et al. .................. | 333/188 |
| 6,483,229 B1 | 11/2002 | Larson, III et al. | |
| 6,566,979 B1 | 5/2003 | Larson, III et al. | |
| 6,662,419 B1 | 12/2003 | Wang et al. | |
| 6,779,878 B1 * | 8/2004 | Higuchi et al. ............. | 347/70 |
| 6,788,170 B1 * | 9/2004 | Kaitila et al. .............. | 333/187 |
| 6,816,035 B1 * | 11/2004 | Ma et al. .................... | 333/187 |
| 6,861,783 B1 * | 3/2005 | Wang et al. ................ | 310/324 |
| 2003/0057806 A1 | 3/2003 | Peczalski | |

(Continued)

FOREIGN PATENT DOCUMENTS

EP    0771070 A2    5/1997

(Continued)

OTHER PUBLICATIONS

Krishnaswamy, S. V., "Film Bulk Acoustic Wave Resonator Technology", *Proceedings of the Ultrasonics Symposium*, Honolulu, HI,(Dec. 4, 1990),529-536.

*Primary Examiner*—Thomas M. Dougherty
(74) *Attorney, Agent, or Firm*—Schwegman, Lundberg, Woessner & Kluth, P.A.

(57) ABSTRACT

A film bulk acoustic resonator is formed on a substrate. The film bulk acoustic resonator includes a layer of piezoelectric material having a first surface proximate the substrate, and a second surface distal from the substrate. The first conductive layer deposited on the first surface of the piezoelectric material includes a first portion having a surface on a different plane than a surface associated with a second portion.

23 Claims, 21 Drawing Sheets

U.S. PATENT DOCUMENTS

| | | |
|---|---|---|
| 2003/0067368 A1 | 4/2003 | Ohara et al. |
| 2003/0102773 A1 | 6/2003 | Ylilammi et al. |
| 2004/0021191 A1 | 2/2004 | Bradley |
| 2004/0021400 A1 | 2/2004 | Bradley et al. |

FOREIGN PATENT DOCUMENTS

| | | |
|---|---|---|
| EP | 1073198 | 1/2001 |
| JP | 2000-263784 | 9/2000 |
| WO | WO-03028211 A2 | 4/2003 |

* cited by examiner

STRUCTURE TO ACHIEVE HIGH-Q AND LOW INSERTION LOSS FILM BULK ACOUSTIC RESONATORS

This application is a divisional of U.S. application Ser. No. 10/716,750 filed Nov. 19, 2003 now U.S. Pat. No. 6,861,783 which is a divisional of U.S. patent application Ser. No. 10/023,594, filed on Dec. 17, 2001. now U.S. Pat. No. 6,662,419 These applications are incorporated herein by reference.

FIELD OF THE INVENTION

The present invention pertains to forming a film bulk acoustic resonator ("FBAR") structure. More specifically, the present invention relates to the methods of forming a structure for a film bulk acoustic resonator having high-Q and low insertion loss.

BACKGROUND OF THE INVENTION

In some instances it is desirable to provide a radio frequency front-end filter. In the past ceramic filters and SAW filters have been used as front-end radio frequency filters. There are problems with SAW filters in that such filters start to have excessive insertion loss above 2.4 gigahertz (GHz). Ceramic filters are large in size and can only be fabricated with increasing difficulty as the frequency increases.

A basic FBAR device 100 is schematically shown in FIG. 1. The FBAR device 100 is formed on the horizontal plane of a substrate 110. A first layer of metal 120 is placed on the substrate 110, and then a piezoelectric layer 130 is placed onto the metal layer 120. The piezoelectric layer can be ZnO, AlN, PZT, any other piezoelectric materials. A second layer of metal 122 is placed over the piezoelectric layer 130. The first metal layer 120 serves as a first electrode 120 and the second metal layer 122 serves as a second electrode 122. The first electrode 120, the piezoelectric layer 130, and the second electrode 122 form a stack 140. A portion of the substrate 110 behind or beneath the stack 140 is removed using back side bulk silicon etching. The back side bulk silicon etching is done using deep trench reactive ion etching or using a crystallographic-orientation-dependent etch, such as KOH, TMAH, and EDP. Back side bulk silicon etching produces an opening 150 in the substrate 110. The resulting structure is a horizontally positioned piezoelectric layer 130 sandwiched between the first electrode 120 and the second electrode 122 positioned above the opening 150 in the substrate. The FBAR is a membrane device suspended over an opening in a horizontal substrate.

FIG. 2 illustrates the schematic of an electrical circuit 200 which includes a film bulk acoustic resonator 100. The electrical circuit 200 includes a source of radio frequency "RF" voltage 210. The source of RF voltage 210 is attached to the first electrode 120 via electrical path 220 and attached to the second electrode 122 by the second electrical conductor 222. The entire stack 140 can freely resonate in the Z direction "$d_{33}$" mode when the RF voltage at resonant frequency is applied. The resonant frequency is determined by the thickness of the membrane or the thickness of the piezoelectric layer 130 which is designated by the letter "d" or dimension "d" in FIG. 2. The resonant frequency is determined by the following formula:

$f_0 \sim V/2d$, where $f_0$=the resonant frequency,

V=acoustic velocity of piezoelectric layer, and d=the thickness of the piezoelectric layer.

It should be noted that the structure described in FIGS. 1 and 2 can be used either as a resonator or as a filter. To form an FBAR, piezoelectric films, such as ZnO and AlN, are used as the active materials. The material properties of these films, such as the longitudinal piezoelectric coefficient and acoustic loss coefficient, are key parameters for the resonator's performance. Key performance factors include Q-factors, insertion loss, and the electrical/mechanical coupling. Currently, to manufacture an FBAR the piezoelectric film is deposited on a metal electrode using reactive sputtering. The resulting films are polycrystalline with a c-axis texture orientation. In other words, the c-axis is perpendicular to the substrate. This processing procedure has several problems.

An FBAR is formed as a piezoelectric layer sandwiched between two electrodes. Top and bottom electrodes are necessary for electrical output of the FBAR Therefore a bottom electrode is required. The starting layer or seed layer for the piezoelectric film deposition for FBAR has been limited to conductive materials. Any other non-conductive or single-crystal materials, which could induce very high-quality or single-crystal piezoelectric films, can not be used as the seed layer using conventional FBAR fabrication techniques.

When a piezoelectric film is sputtered onto a conductive metal, the initial layer of approximately 0.05 um of the sputtered film typically consists of a polycrystalline material with partially developed texture. This initial layer has poor piezoelectric effect. This degrades the overall film quality. This becomes a performance issue for high frequency FBARs having a resonance frequency of 10 GHz or above which has a piezoelectric film about 0.2 um thick.

Thus, there is need for an FBAR device and a method for producing an FBAR device that results in a single-crystal piezoelectric film. There is also a need for a method of fabricating an FBAR device that has good performance qualities and which uses a seed layer other than a highly conductive electrode. There is also a need for a fabrication technique where an initial sputtered layer of piezoelectric material can be removed since this layer may be polycrystalline and have poor piezoelectric effect.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

The description set out herein illustrates the various embodiments of the invention and such description is not intended to be construed as limiting in any manner.

DETAILED DESCRIPTION

Described in FIGS. 3A–22B are the various process steps used to make one of several embodiments of the inventive film bulk acoustic resonator "FBAR."

Figure 1:
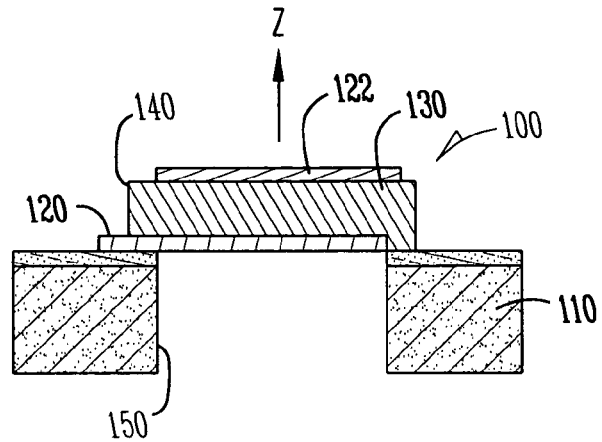
FIG. 1 illustrates a cross sectional view of a prior art film bulk acoustic resonator.
Figure 2:
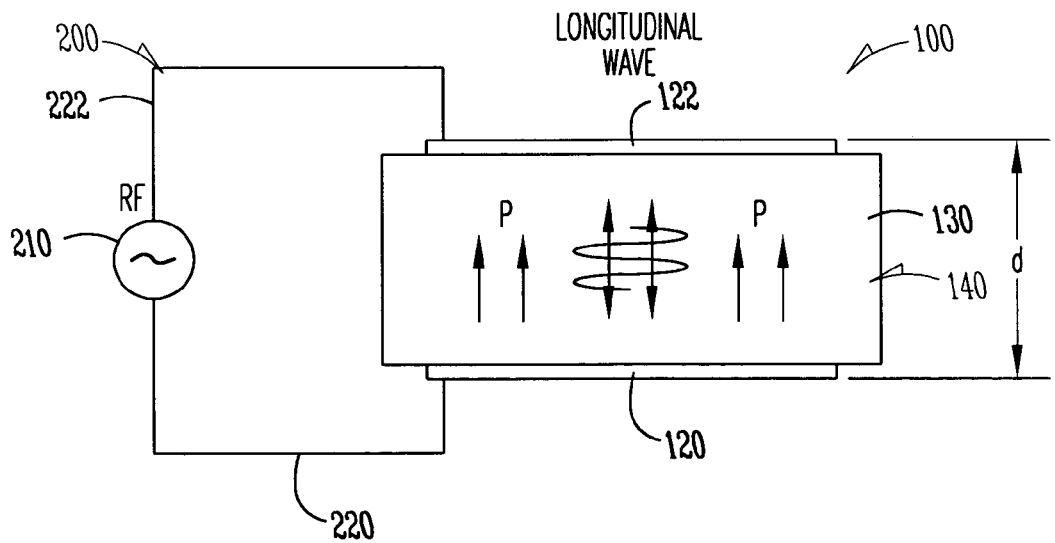
FIG. 2 illustrates a schematic of an electrical circuit of a film bulk acoustic resonator.
Figure 3A:
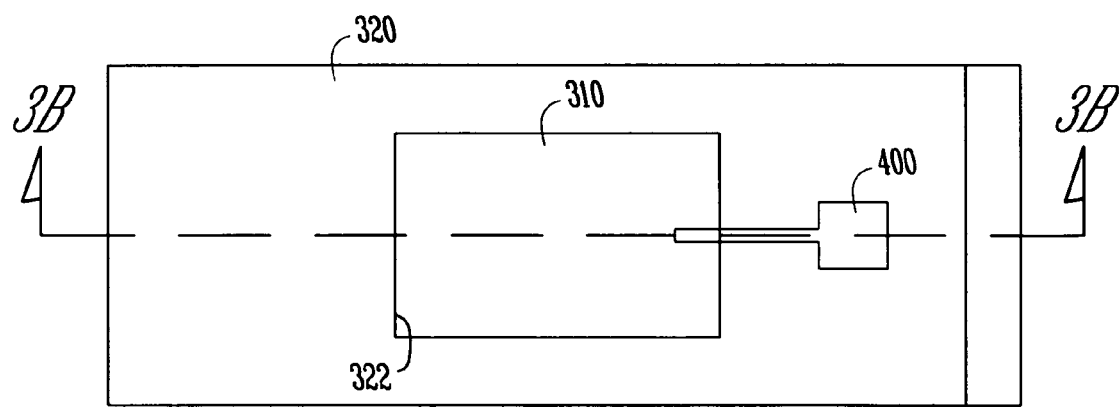
FIG. 3A illustrates a top view of a single crystal substrate with a dielectric layer and a portion of a first electrode thereon.
Figure 3B:
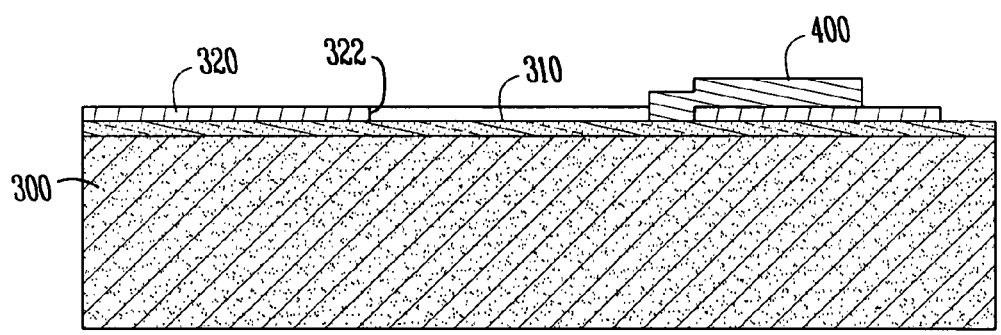
FIG. 3B illustrates a side view of a substrate or wafer shown in FIG. 3A.

One embodiment of the invention is discussed with reference to FIGS. 3A–7B. FIGS. 3A and 3B illustrate a top and side view of a single crystal substrate 300 with a single crystal seed layer 310 and a dielectric layer 320. A first portion of a first electrode 400 is formed on a portion of the seed layer 310 and on a portion of the dielectric layer 320. The single crystal substrate 300 can be silicon or silicon carbon (Si, or SiC). The single crystal seed layer 310 is needed to facilitate single crystal piezoelectric film growth. It should be understood that if the single crystal substrate 300 is capable of facilitating the single crystal piezoelectric film growth, the single crystal seed layer 310 may not be needed. The dielectric layer 320 is needed for isolation or prevention of a metal reaction with the seed layer 310 or a metal reaction with the substrate 300. The dielectric layer 320 is patterned to open a window 322. The window exposes the single crystal seed layer 310 so that a piezoelectric film can be grown on the exposed portion of the single crystal seed layer 310. After the window 322 has been formed in the dielectric layer 320, the first portion of the first electrode 400 is formed so that it covers a portion of the single crystal seed layer 310 within the window 322, so that it covers a portion of the dielectric layer 320. The first portion of the first electrode 400 may also be termed as a buried metal trace and will be used to make electrical contact with the device, as will be shown and discussed with respect to FIGS. 7A and 7B.

Figure 4A:
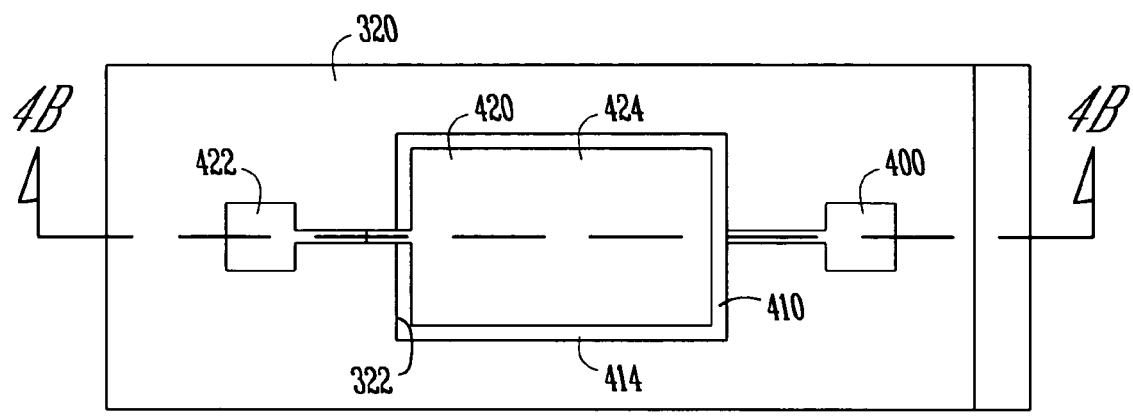
FIG. 4A illustrates a substrate after a piezoelectric film and second electrode have been deposited on the substrate.
Figure 4B:
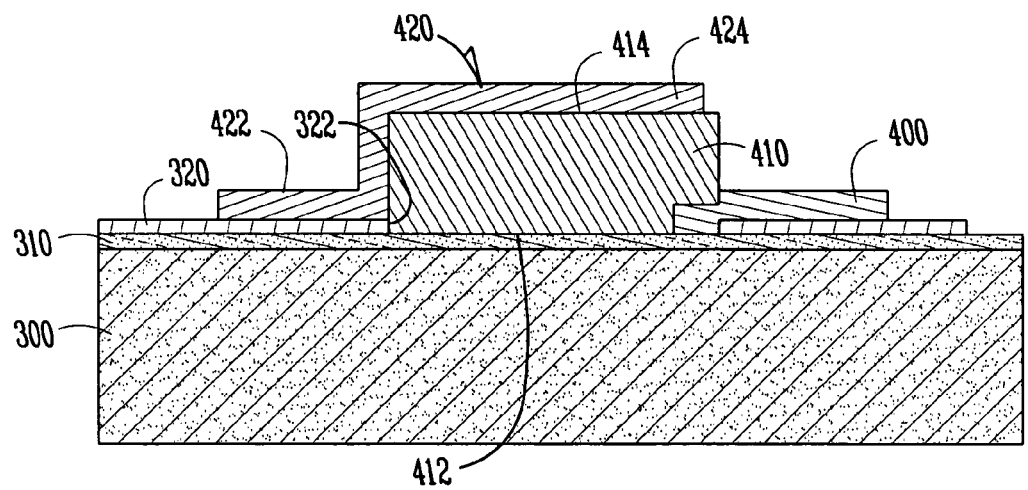
FIG. 4B illustrates a side view of a substrate shown in FIG. 4A.

FIGS. 4A and 4B illustrate top and side views, respectively, of the substrate 300 after a piezoelectric film 410 and a second electrode 420 have been deposited on the substrate 300. Initially, a single crystal piezoelectric film 410 is deposited and patterned so that it is deposited within the window 322 where the single crystal seed layer 310 is exposed. The single crystal piezoelectric film 410 has a first surface 412 which is formed in contact with the single crystal seed layer 310. The first surface of the single crystal piezoelectric film 410 is in close proximity to the substrate 300. The single crystal piezoelectric film 410 also includes a second surface 414 which is remote from the single crystal substrate 300.

After the piezoelectric film 410 is formed and patterned, a second electrode 420 is deposited and patterned. The second electrode 420 includes a first portion 422 and a second portion 424. The second portion 424 is deposited over the second surface 414 of the piezoelectric crystal 410. The first portion 422 of the second electrode 420 is deposited on the dielectric layer 320 and also makes electrical contact with the second portion 424 of the second electrode 420. In other words, the first portion of the second electrode 420 includes an electrical contact pad and a portion which is deposited on the sidewall of the piezoelectric film 410. The first portion 422 of the second electrode 420 also includes a portion that is deposited on the second surface 414 of the piezoelectric crystal 410 so that the first portion is in electrical communication with the second portion 424 of the second electrode 420. The second electrode 420 may also be termed as the top electrode of the FBAR device formed.

Figure 5A:
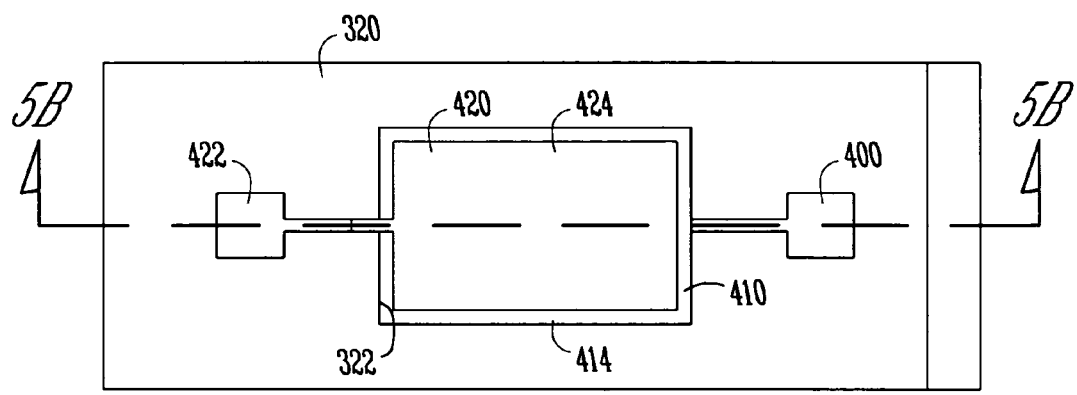
FIG. 5A illustrates a substrate after a portion of the substrate material beneath the piezoelectric material has been removed.
Figure 5B:
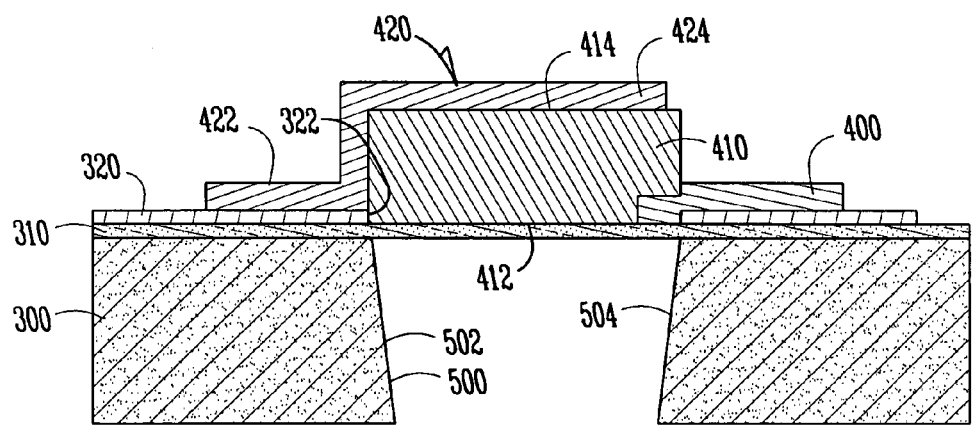
FIG. 5B illustrates a side view of a substrate shown in FIG. 5A.

FIGS. 5A and 5B illustrate top and side views respectively of the substrate 300 after a portion of the substrate material beneath the piezoelectric layer and the seed layer 310 have been removed. Removing a portion of the substrate 300 produces an opening 500 on the back side of the substrate. The substrate material 300 that is removed corresponds to the portion of the substrate 300 which is under the active area of the final device or FBAR. The substrate material is removed using deep-trench reactive-ion etching (DRIE). The etched profile of the DRIE is adjusted to be negative so as to produce a first sloped sidewall 502 and a second sloped sidewall 504.

Figure 6A:
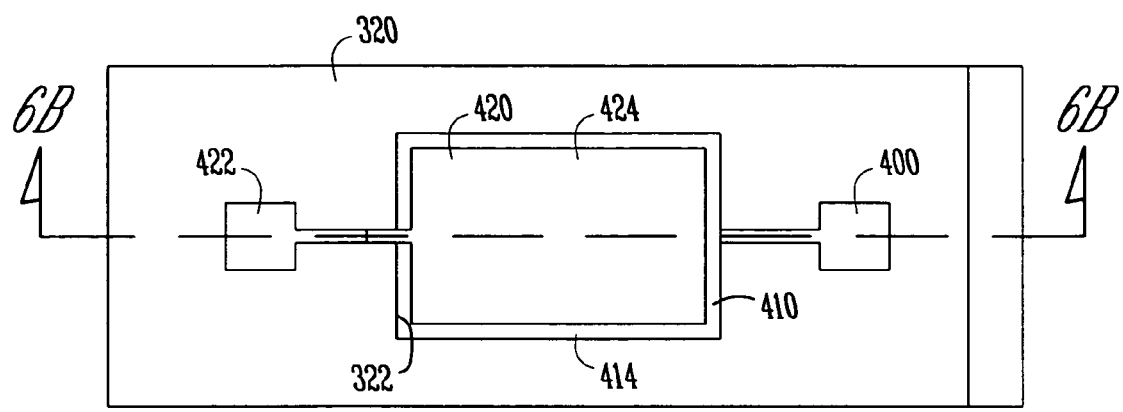
FIG. 6A illustrates a substrate after a portion of the seed layer beneath the piezoelectric material has been removed.
Figure 6B:
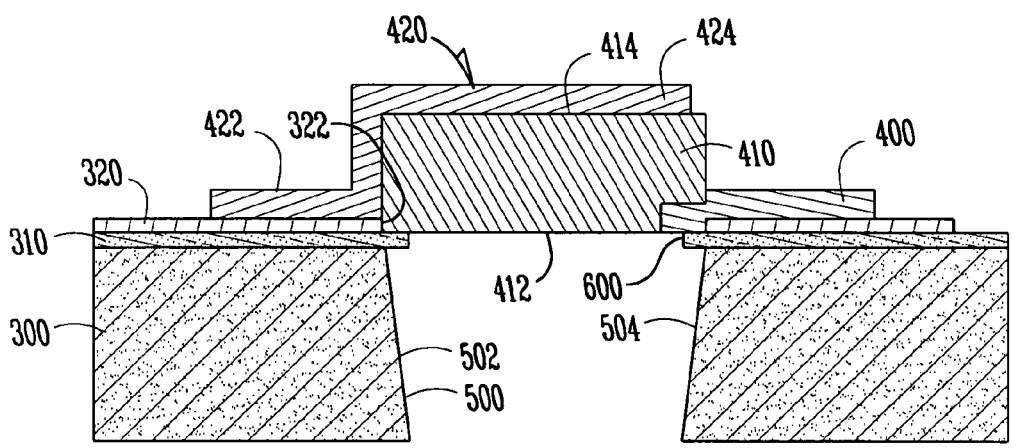
FIG. 6B illustrates a side view of a substrate shown in FIG. 6A.

FIGS. 6A and 6B illustrate the substrate after a portion of the seed layer 310 beneath the piezoelectric film 410 has been removed. The single crystal seed layer 310 is etched from the back side of the wafer through the previously etched DRIE window or opening 500 formed when the substrate material 300 was removed from the back side of the wafer. The etch for removing the single crystal seed layer 310 is self aligned and is stopped on the piezoelectric layer 410 by end point detection. More specific, the etch for removing the single crystal seed layer 310 stops at or near the first surface 412 of the piezoelectric layer 410. The etch to remove the single crystal seed layer 310 exposes the piezoelectric layer 410 and specifically surface 412 along the back side of the substrate. This etch can be said to form a second window 600 which is bounded by the single crystal seed layer 310 and exposes the surface 412 of the piezoelectric crystal 410 at the back side of the substrate 300.

Figure 7A:
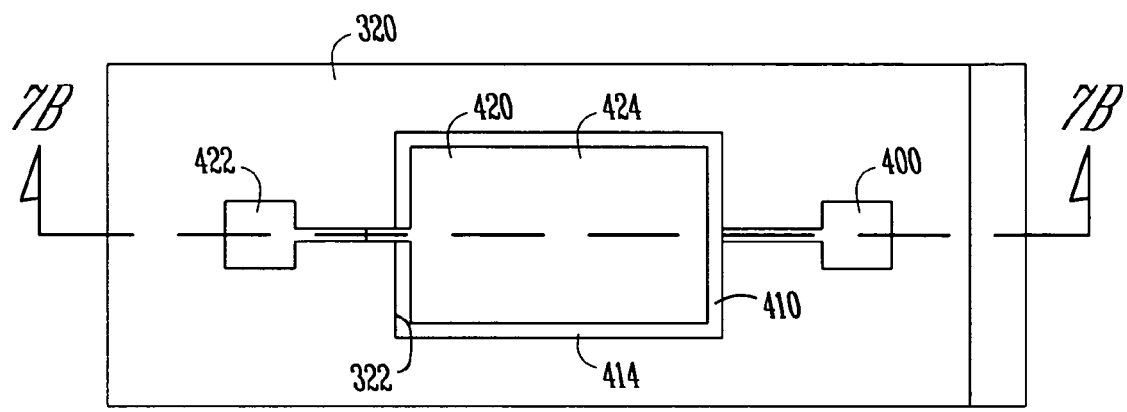
FIG. 7A illustrates a substrate after a second portion of the first electrode is deposited on the piezoelectric layer and on the first portion of the first electrode.
Figure 7B:
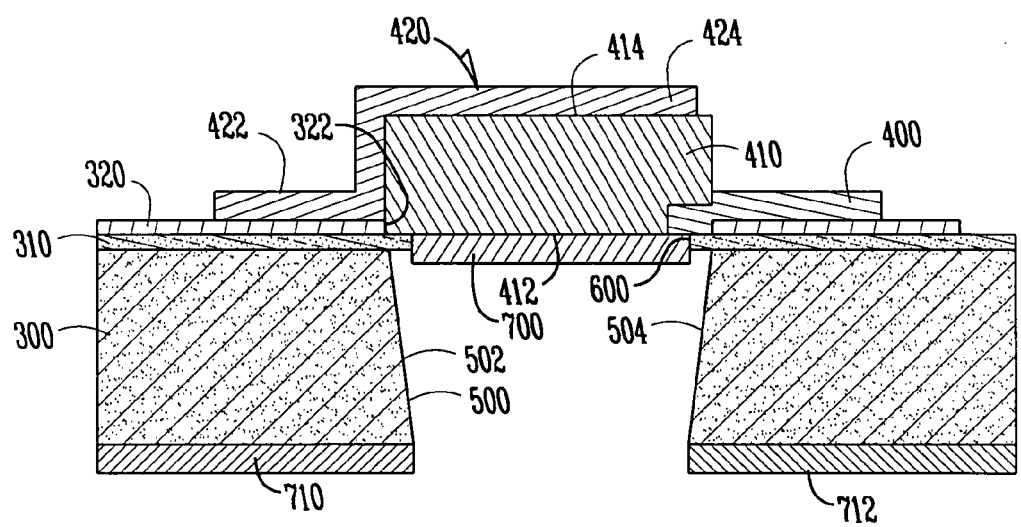
FIG. 7B illustrates a side view of a substrate shown in FIG. 7A.

FIGS. 7A and 7B show top and side views of the substrate after a second portion 700 of the first electrode is deposited on the first surface 412 of the piezoelectric film 410. The bottom electrode metal is deposited from the back side of the wafer. Depositing metal from the back side of the wafer or substrate 300 produces the second portion 700 of the first electrode. The back side surface of the substrate 300 is also metallized as is shown by metal layers 710 and 712 in FIG. 7B. The second electrode 700 makes electrical contact with the first portion of the first electrode 400 or what is also known as the buried metal trace. It should be noted that there is no metal deposited on the sidewalls of the opening 500. When the opening 500 was made, the DRIE was adjusted to be negative thereby producing sloping sidewalls 502 and 504. When the metal layer is deposited which forms the second portion 700 of the first electrode, the sloped sidewalls prevent deposit of metal on the sidewalls 502, 504. This prevents a continuous metal layer being formed over all the bulk silicon substrate 300 and provides for a separate electrode 700 which covers most of the first surface 412 of the piezoelectric film 410. It should be noted that the first portion 400 of the first electrode and the second portion 700 of the first electrode form the first electrode. Typically the second portion 700 of the first electrode overlaps the first portion 400 of the first electrode by an amount to provide adequate electrical connection between the first portion 400 and the second portion 700 of the first electrode. As shown, the overlapping is approximately 10 micrometers.

Figure 8A:
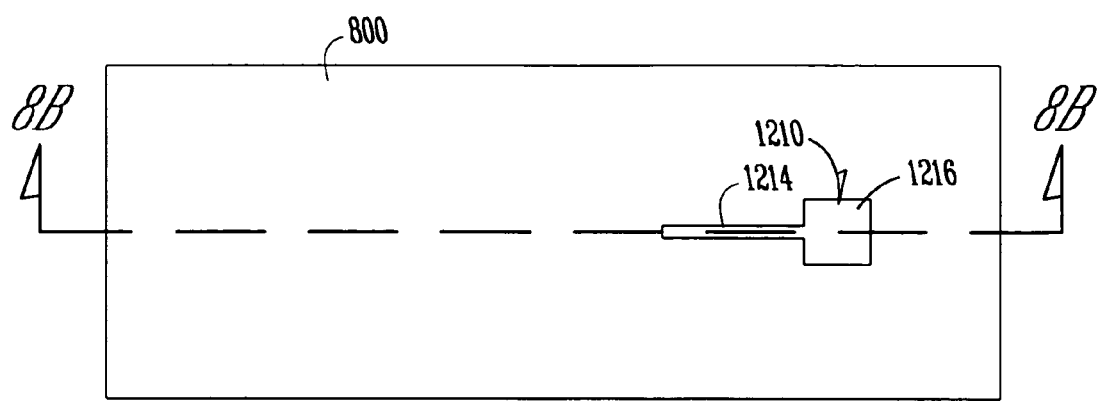
FIG. 8A illustrates a top view of a substrate with a non-conductive seed layer and a portion of a first electrode thereon.
Figure 8B:
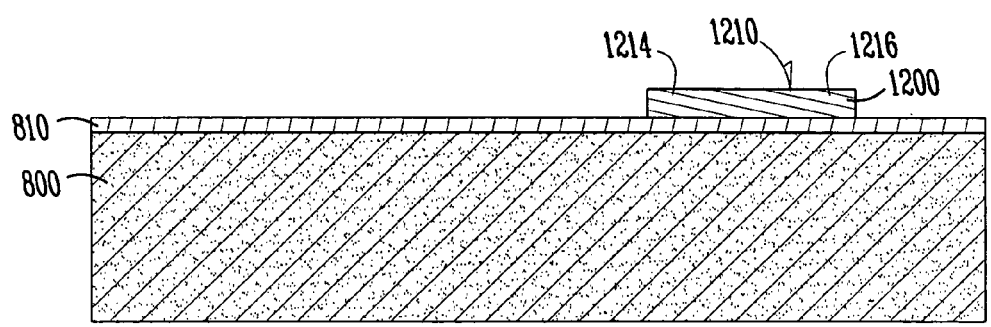
FIG. 8B illustrates a side view of a substrate shown in FIG. 8A.

Now turning to FIGS. 8A to 12B, a second embodiment and method for forming an FBAR having high Q and low insertion loss will be discussed. In the second embodiment, fabrication procedures that enable using a nonconductive seed layer for a piezoelectric film deposition will be discussed. FIGS. 8A and 8B illustrate a top and side view, respectively, of a substrate 800 having a nonconductive seed layer 810 and a first portion 1210 of a first electrode 1200 (the entire first electrode is shown in FIG. 12B). The seed layer 810 can be any nonconductive material which can induce a high-quality piezoelectric film when deposited on the seed layer 810. Advantageously, the particular seed layer 810 used on the substrate 800 is not limited to conductive material. Therefore the seed layer 810 can be selected to optimize particular qualities of a piezoelectric film or layer that is grown upon the seed layer. A metal layer is deposited and patterned onto the seed layer. The metal layer forms a first portion 1210 of a first electrode or bottom electrode contact. The metal layer 1210 may also be termed as a buried metal trace and includes a first portion 1214 and a second portion 1216. The second portion 1216 is an electrical contact pad.

Figure 9A:
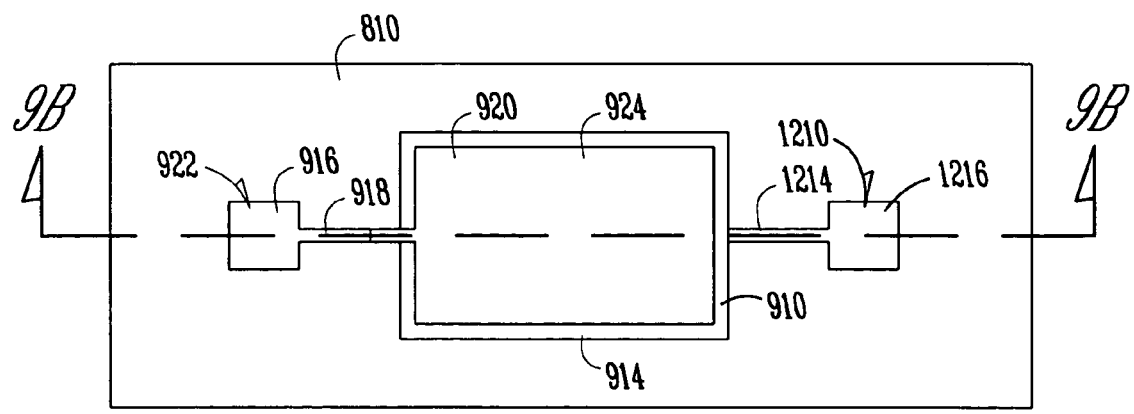
FIG. 9A illustrates a substrate after a piezoelectric film and a second electrode has been deposited thereon.
Figure 9B:
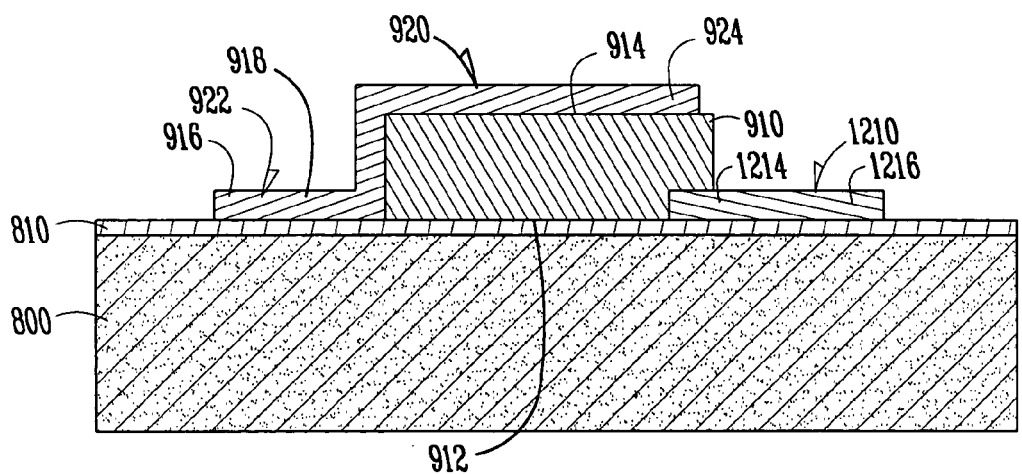
FIG. 9B illustrates a side view of a substrate shown in FIG. 9A.

FIGS. 9A and 9B illustrate top and side views of the substrate 800 after a piezoelectric film 910 has been deposited upon the seed layer 810 and after a second electrode 920 has been deposited and patterned on the seed layer and on the piezoelectric film. A single crystal piezoelectric film 910 is deposited and patterned on the seed layer 810. The seed layer 810 is any nonconductive material which induces the deposit of high-quality piezoelectric films on the seed layer. The piezoelectric film 910 includes a first surface 912 which is proximate the substrate 800. The first surface 912 actually contacts or interfaces with the seed layer 810. The piezoelectric film 912 also includes a second surface 914 which is remote from the substrate 800. The second electrode 920 includes a first portion 922 and a second portion 924. The second portion 924 is deposited on the second surface 914 of the piezoelectric film 910. The second portion 924 covers most of the second surface 914 of the piezoelectric film or layer 910. The first portion 922 of the second electrode 920 includes a pad 916 and an electrical trace 918. The electrical trace 918 electrically connects the pad 916 and the second portion 924 of the second electrode. Therefore, the trace 918 has a portion that is deposited upon the surface 914 of the second surface 914 of the piezoelectric layer 910. The trace 918 also is deposited upon the sidewall or vertical surface of the piezoelectric film 910. The top electrode or second electrode 920 is deposited and then patterned to form the first portion 922 and the second portion 924.

Figure 10A:
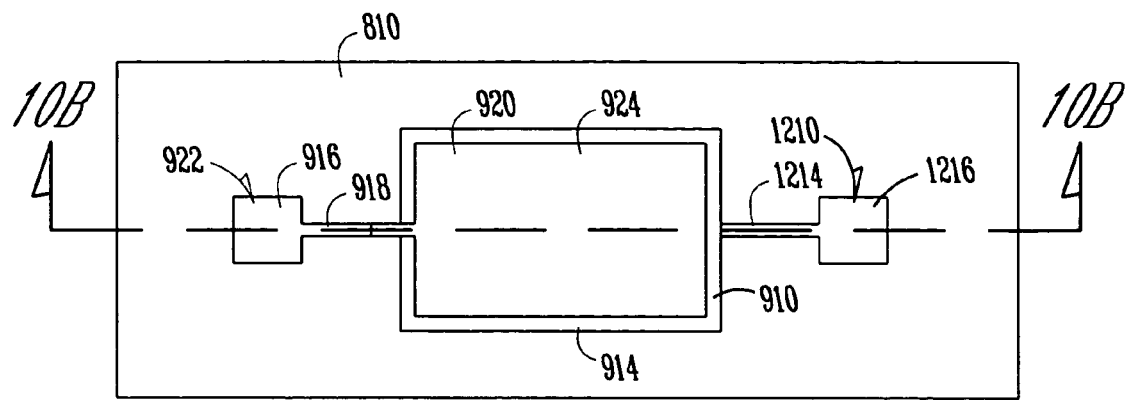
FIG. 10A illustrates a substrate after a portion of the substrate material beneath the piezoelectric material has been removed.
Figure 10B:
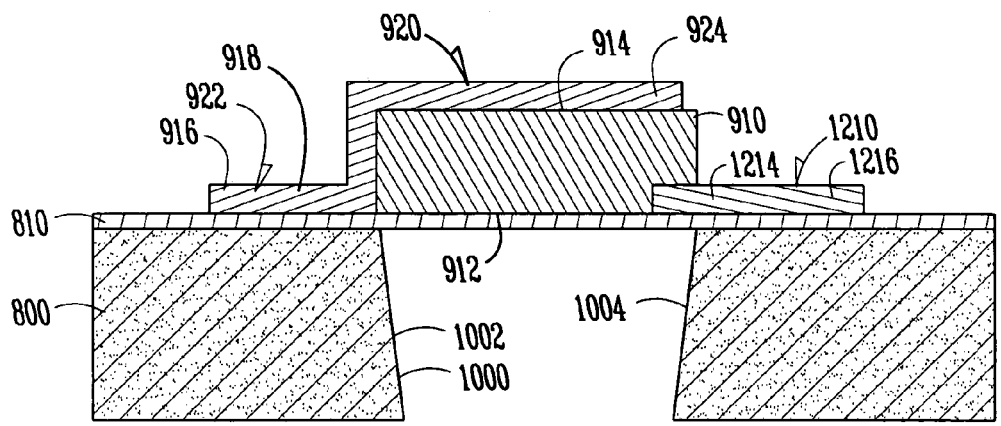
FIG. 10B illustrates a side view of a substrate shown in FIG. 10A.

FIGS. 10A and 10B illustrate the substrate 800 after a portion of the substrate material beneath the piezoelectric film 910 has been removed. As best illustrated by FIG 10B, the silicon substrate under piezoelectric film 910 is removed using deep-trench reactive-ion etching (DRIE). Removing a portion of the silicon substrate 800 from the back side of the substrate 800, produces an opening 1000. The opening 1000 can also be termed a DRIE etch window. The etch profile of the DRIE window or opening 1000 is adjusted to be negative. The negative etched profile of the opening or DRIE window 1000 produces a first sloped sidewall 1002 and a second sloped sidewall 1004.

Figure 11A:
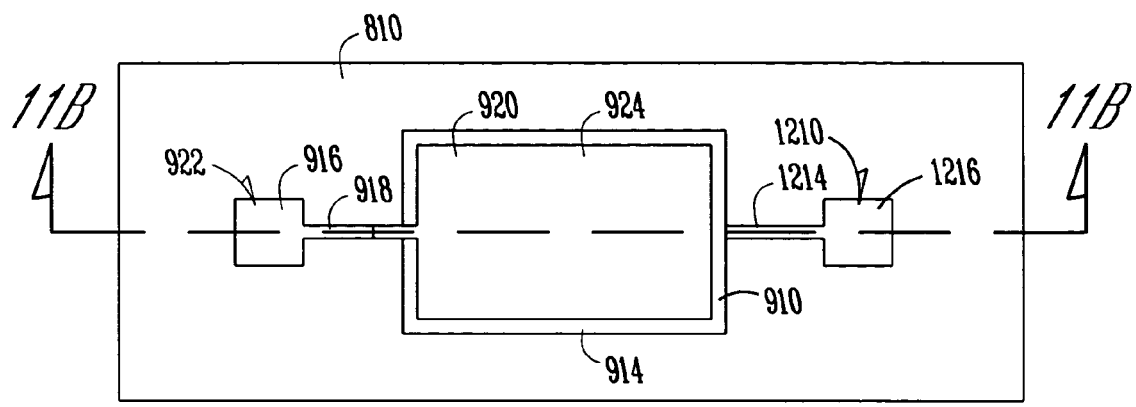
FIG. 11A illustrates a substrate after a portion of the seed layer beneath the piezoelectric material has been removed.
Figure 11B:
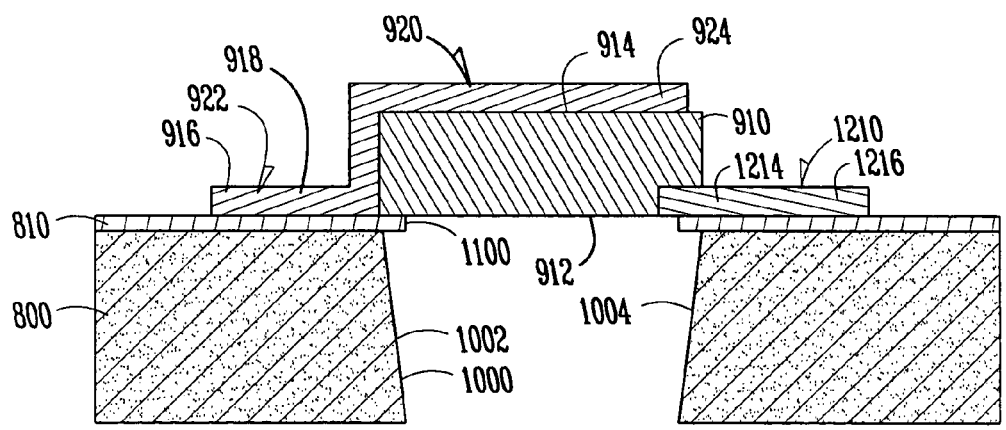
FIG. 11B illustrates a side view of a substrate shown in FIG. 11A.

FIGS. 11A and 11B illustrate the substrate or the device after a portion of the seed layer beneath the piezoelectric material or beneath the piezoelectric film 910 has been removed. The nonconductive seed layer 810 is etched or removed from the back side of the substrate through the previously etched DRIE window or opening 1000. The etch is self aligned and effectively stops on the piezoelectric layer 910 by end point detection. Specifically, the etch stops at or near the first surface 912 of the piezoelectric layer or film 910. The result of the etch from the back side that removes the nonconductive seed layer 810 is an opening 1100 in the seed layer 810. The opening 1100 exposes surface 912 of the piezoelectric film or layer 910 as well as part of the portion 1214 of the first portion 1210 of the first electrode.

Figure 12A:
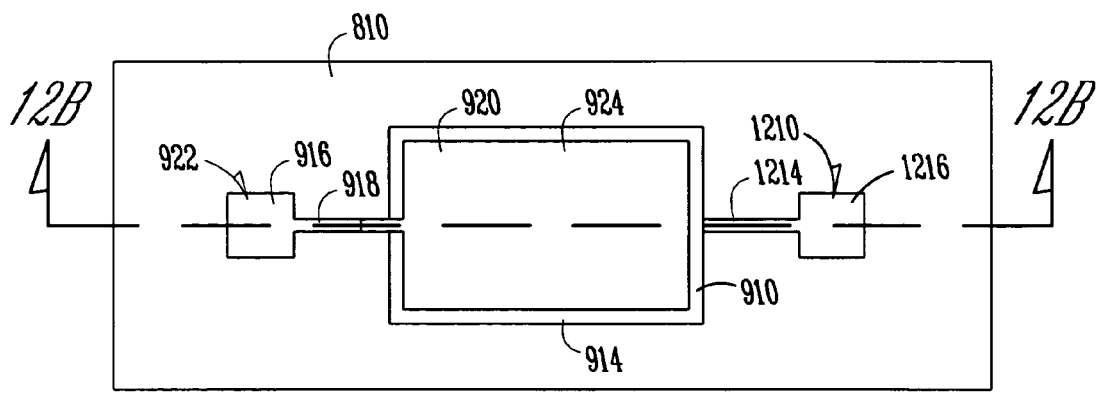
FIG. 12A illustrates a substrate after a second portion of the first electrode is deposited on the piezoelectric layer and on the first portion of the first electrode.
Figure 12B:
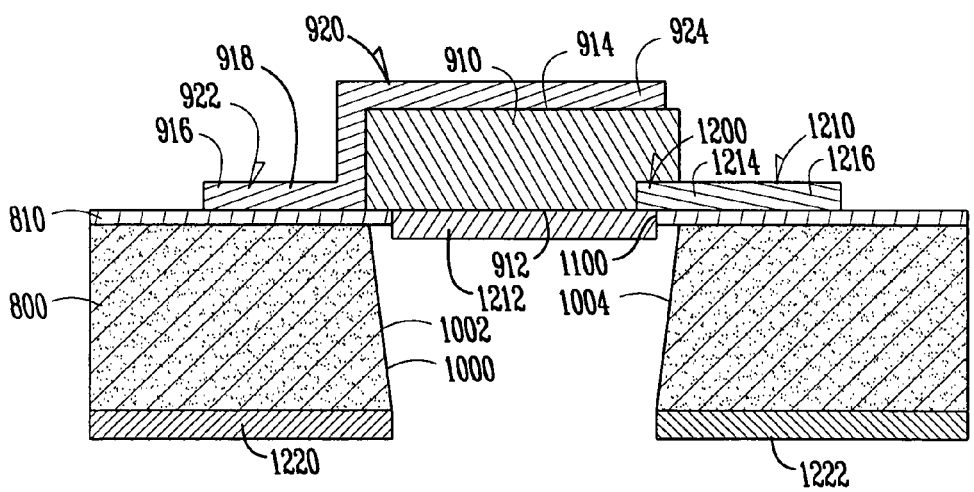
FIG. 12B illustrates a side view of a substrate shown in FIG. 12A.

FIGS. 12A and 12B illustrate top and side views, respectively, of the substrate after the back side of the substrate 800 is metallized. Metal is deposited on the back side of the wafer. The deposited metal form the second portion 1212 of the first electrode 1200 as well as metallized layers 1220 and 1222 on the back side of the substrate 800. The opening 1000 or DRIE window which was previously adjusted to have a negative profile and to produce sloping sidewalls 1002 and 1004 prevents deposit of the metal on the sidewalls 1002, 1004. This in turn prevents a continuous metal layer being formed on the bulk silicon substrate so that the second portion 1212 of the first electrode 1200 is separated from the other metallized portions 1220 and 1222. The second portion 1212 of the first electrode 1200 contacts the first portion 1210 of the first electrode. The first portion 1210 and the second portion 1212 of the first electrode 1200 overlap so that electrical contact is made between the first and second portions. In this particular embodiment, the overlap is approximately 12 micrometers.

Figure 13A:
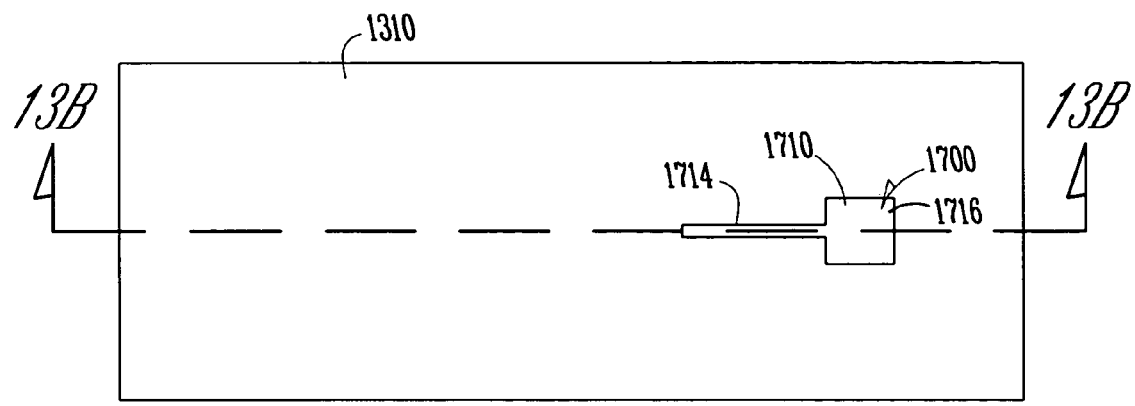
FIG. 13A illustrates a top view of a substrate with a seed layer and a portion of a first electrode thereon.
Figure 13B:
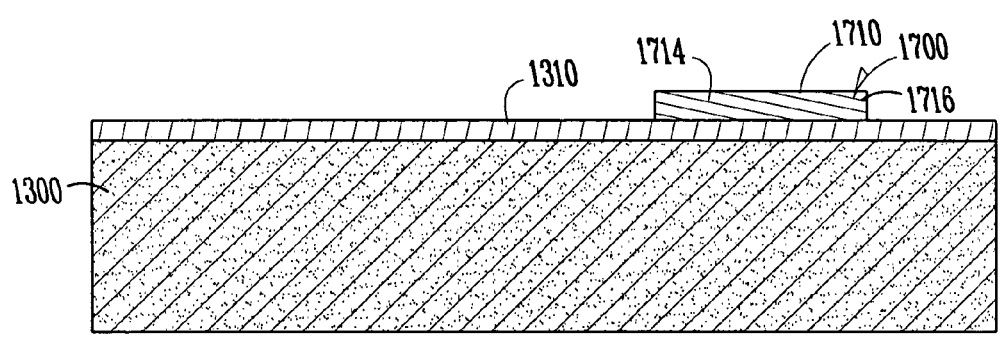
FIG. 13B illustrates a side view of a substrate shown in FIG. 13A.

Now turning to FIGS. 13A–17B, a third embodiment of the invention will be discussed. In the third embodiment, a structure and fabrication procedure to enable removal of an initial piezoelectric film of poor quality is discussed. FIGS. 13A and 13B illustrate a side view and top view, respectively of a substrate 1300 having a nonconductive seed layer 1310 and a first portion 1710 of a first electrode 1700 (the entire first electrode is shown in FIG. 17B). The starting seed layer 1310 is first deposited upon the substrate 1300. The seed layer may be a dielectric material or any other nonconductive material chosen so that a good quality piezoelectric film will be formed when the piezoelectric material or film is deposited onto the seed layer 1310. It should be noted that the substrate 1300 itself could be used as the nonconductive "seed layer." The metal layer or first portion 1710 of the first electrode is deposited and patterned for later contact with a second portion of the first electrode. The first electrode portion 1710 includes a contact pad 1716 and an electrical trace 1714. The first portion 1710 of the first electrode may also be termed as a buried metal trace.

Figure 14A:
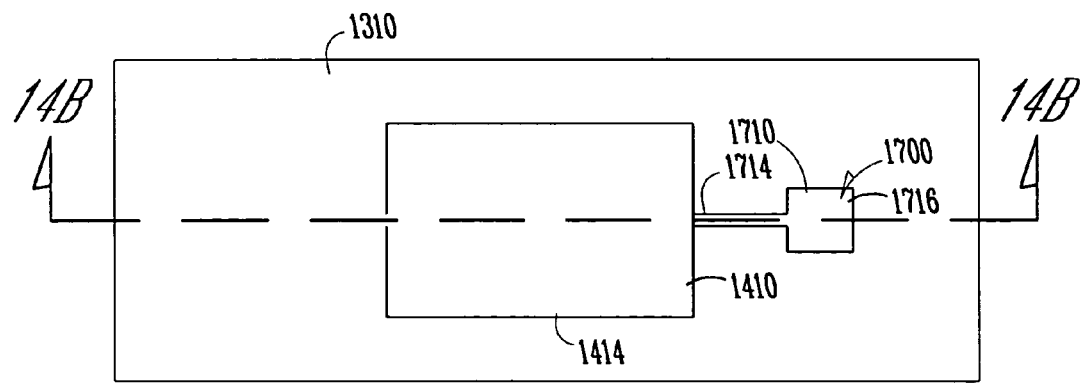
FIG. 14A illustrates a substrate after a piezoelectric film has been deposited thereon.
Figure 14B:
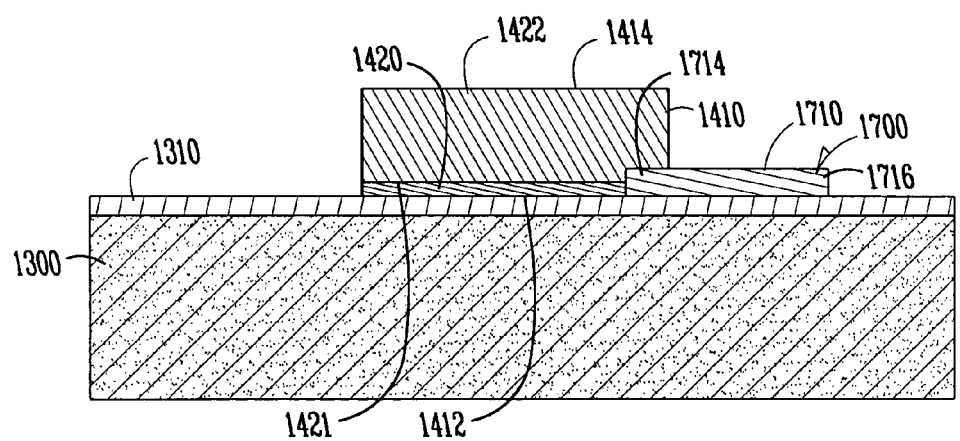
FIG. 14B illustrates a side view of a substrate shown in FIG. 14A.

FIG. 14A and FIG. 14B illustrate top and side views of the substrate 1300 after the piezoelectric film 1410 has been deposited on the seed layer 1310 of the substrate 1300. The piezoelectric material is deposited and patterned to form the piezoelectric film 1410. The piezoelectric film 1410 includes a first surface 1412 which is proximate the substrate 1300 and includes a second surface 1414 which is distal or remote from the substrate 1300. The initial layers 1420 of the deposited film may have a poor texture. The initial layers of the film are denoted by the reference numeral 1420. The initial layers of the piezoelectric film 1410 are approximately 0.05 micrometers in thickness. After the initial layers of poor texture piezoelectric material, designated by the reference numeral 1420, the piezoelectric material then starts growing in C-axis oriented texture, as depicted by reference numeral 1422. The interface between the poor texture area 1420 and the volume of piezoelectric material that grows in C-axis oriented texture 1422 has been designated by the reference numeral 1421.

Figure 15A:
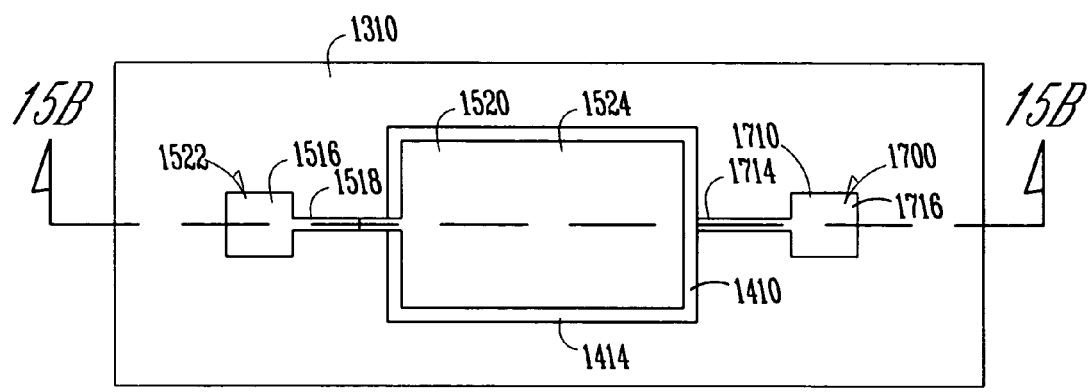
FIG. 15A illustrates a substrate after a second electrode has been deposited on the piezoelectric film and after a portion of the substrate has been removed from the back side of the substrate.
Figure 15B:
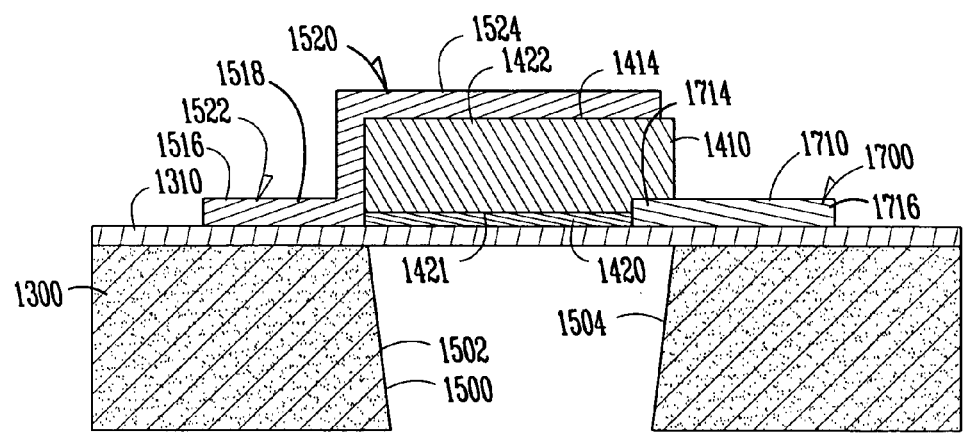
FIG. 15B illustrates a side view of a substrate shown in FIG. 15A.

FIGS. 15A and 15B illustrate the substrate after a second electrode 1520 has been deposited on the substrate 1300 and after a portion of the substrate 1300 has been removed from the back side of the substrate 1300. After the piezoelectric film 1410 has been deposited onto the seed layer 1310 of the substrate 1300, a second electrode 1520 is deposited and patterned. The second electrode includes a first portion 1522 and a second portion 1524. The second portion 1524 covers or substantially covers the surface 1414 of the piezoelectric film 1410. The first portion 1522 of the second electrode 1520 includes a pad 1516 and an electrical contact or trace 1518 which connects the pad 1516 to the second portion 1524 of the second electrode 1520. The trace 1518 is deposited upon the sidewall of the piezoelectric film 1410, on the seed layer 1310 and on the second surface 1414 of the piezoelectric film 1410. As mentioned previously, the trace 1518 provides electrical contact between the first portion 1522 and the second portion 1524 of the second electrode 1520.

As best seen in FIG. 15B, the silicon substrate 1300 beneath the piezoelectric film 1410 has been removed by deep-trench reactive-ion etching (DRIE). Removal of the substrate portion beneath the piezoelectric film 1410 creates an opening 1500 which also may be referred to as a DRIE window. The etched profile of the DRIE window or opening 1500 is adjusted to be negative, thereby producing a first sloped sidewall 1502 and a second sloped sidewall 1504.

Figure 16A:
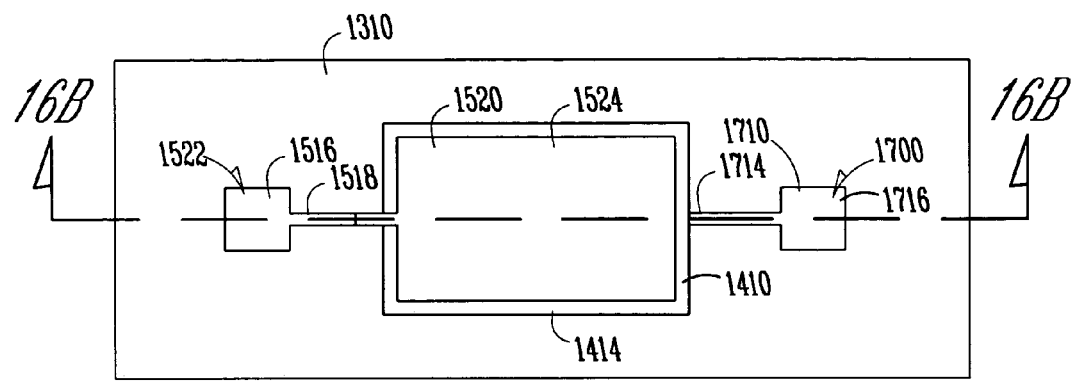
FIG. 16A illustrates a substrate after a portion of the substrate, and a portion of the seed layer beneath the piezoelectric material, and a portion of the piezoelectric material have been removed.
Figure 16B:
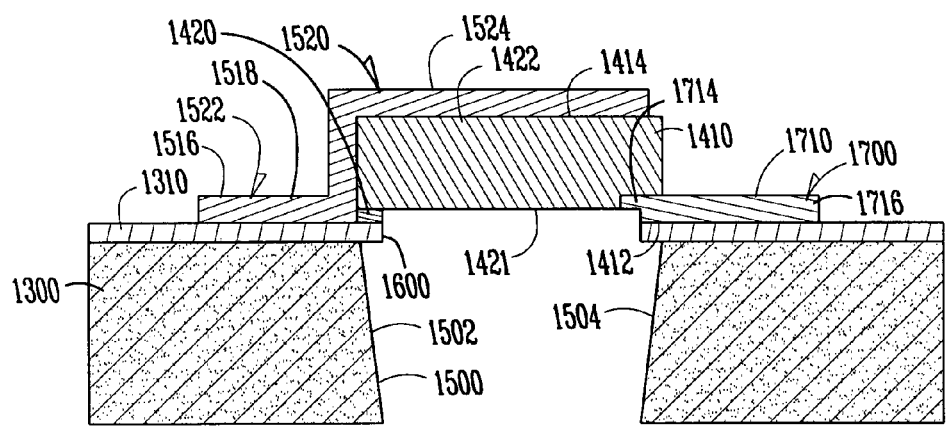
FIG. 16B illustrates a side view of a substrate shown in FIG. 16A.

FIGS. 16A and 16B illustrate the substrate 1300 after a portion of the substrate, a portion of the seed layer 1310 and a portion of the piezoelectric material 1420, have been removed from the back side surface of the substrate 1300. A portion of the seed layer 1310 and a portion of the poorly oriented piezoelectric layer 1420 are etched from the back side of the substrate 1300 through the previously etched opening 1500 or DRIE window. The etch is self aligned. The etching of the seed layer can effectively stop on the piezoelectric layer 1410 by end point detection. The etching of the poorly oriented piezoelectric film or films 1420 is based on time control. In other words, a DRIE etch removes material at a certain rate. Therefore, for a given amount of time, a given amount of material is generally removed. The etch for removing a portion of the seed layer 1310 and a portion of the poorly oriented piezoelectric layer 1420 is conducted so that the entire thickness of the poorly oriented piezoelectric layer 1420 is removed and yet so that not all of the thickness of the first portion 1710 of the first electrode is removed. The etch is conducted until the interface between the poorly oriented piezoelectric layer 1420 and the C-axis oriented portion 1422 of the piezoelectric film 1410 is either just met or slightly passed. In other words, after the etching is complete, only C-axis oriented film 1422 remains.

Figure 17A:
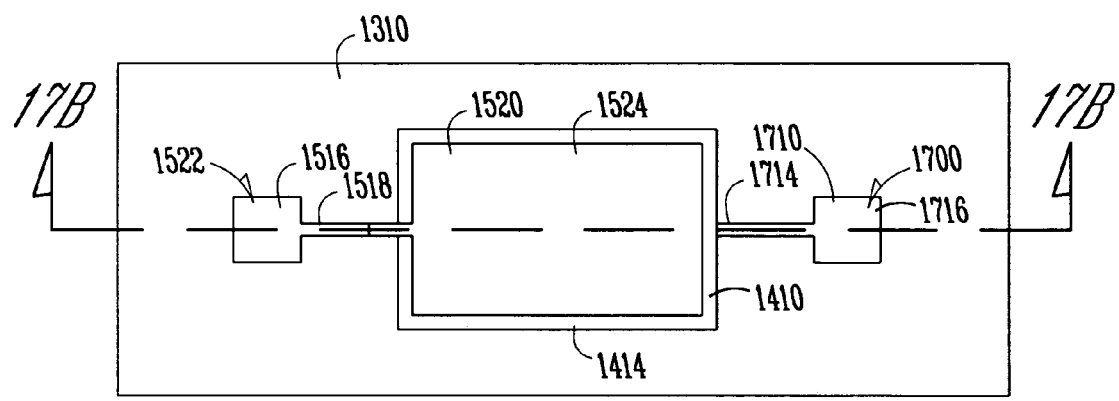
FIG. 17A illustrates a substrate after a second portion of the first electrode is deposited on the piezoelectric layer and on the first portion of the first electrode.
Figure 17B:
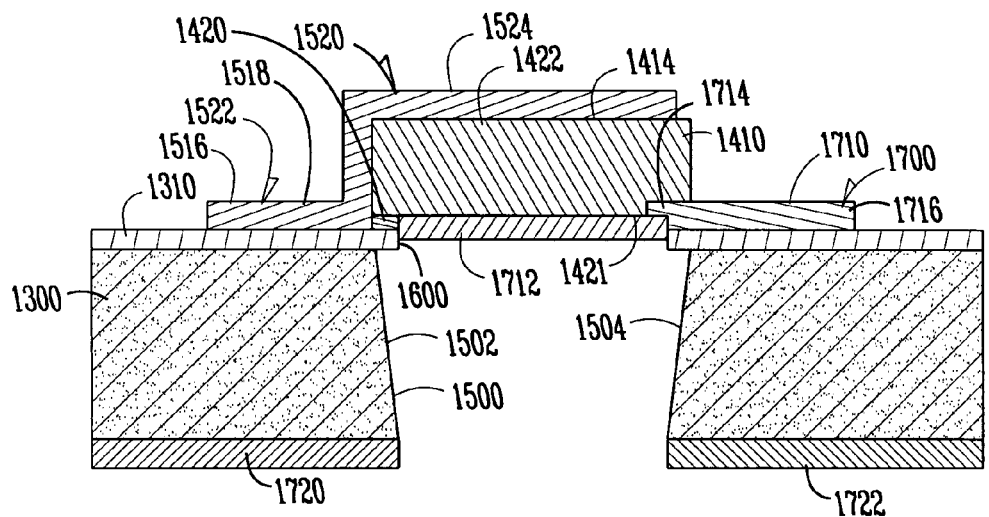
FIG. 17B illustrates a side view of a substrate shown in FIG. 17A.

FIGS. 17A and 17B show top and side views, respectively, of the substrate 1300 after a second portion 1712 of the first electrode 1700 has been deposited from the back side of the substrate 1300 onto the C-axis oriented portion 1422 of the piezoelectric film 1410. The back side of the substrate 1300 is metallized resulting in the second portion 1712 of the first electrode being deposited through the DRIE window previously formed. Metal is deposited on the entire back side of the substrate which also produces metallized films or portions 1720 and 1722. The second portion 1712 and the first portion 1710 form the first electrode 1700. The second portion 1712 of the first electrode 1700 overlaps the first portion 1710 of the first electrode by approximately 10 micrometers so that electric contact is made between the first portion 1710 and the second portion 1712. It should be noted that there is no metal deposited upon the sidewalls 1502 and 1504 of the opening 1500 due to the fact that the DRIE previously performed was adjusted to be negative. As a result the bottom electrode or second portion 1712 of the first electrode 1710 is prevented from forming a continuous metal film across the entire back side of the substrate 1300. The advantage of this particular embodiment is that the poorly oriented film portion 1420 is removed so that the FBAR formed by the piezoelectric layer 1410 and the first electrode 1700 and the second electrode 1520 only have C-axis oriented piezoelectric material between the electrodes. This forms an FBAR device having desirable qualities of high Q and low insertion loss.

Figure 18A:
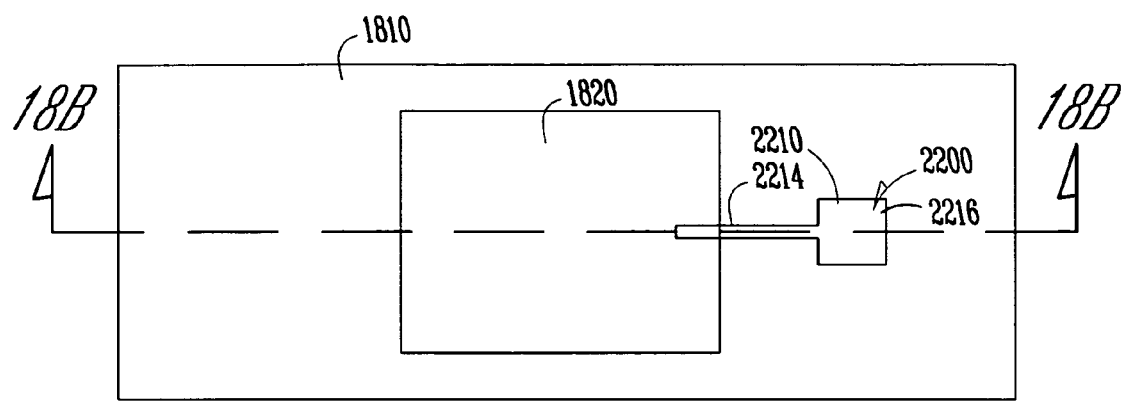
FIG. 18A illustrates a top view of a substrate with a dielectric film, a conductive seed layer, and a portion of a first electrode thereon.
Figure 18B:
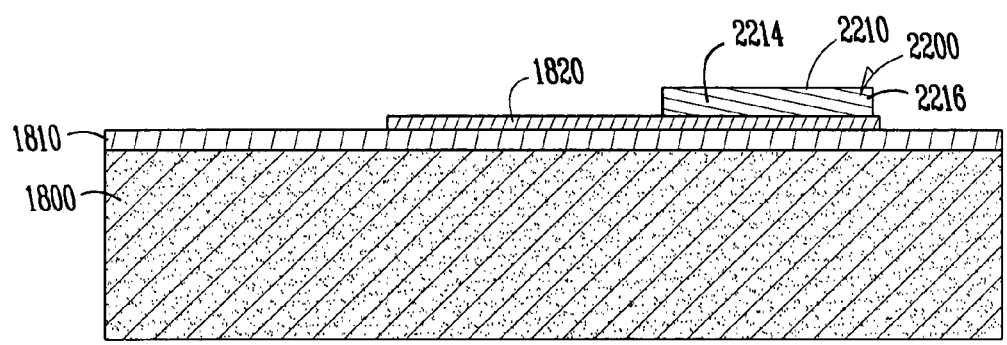
FIG. 18B illustrates a side view of a substrate shown in FIG. 18A.

Now turning to FIGS. 18A–22B, a fourth embodiment of the invention will be discussed. In the fourth embodiment, a structure and fabrication procedure that enables the removal of initial piezoelectric film of poor quality is discussed. In this embodiment, the seed layer is formed of a conductive material. FIGS. 18A and 18B show top and side views of a substrate 1800 having a dielectric film 1810, a conductive seed layer 1820 and a first portion 2210 of a first electrode 2200 (the entire first electrode is shown in FIG. 22B) deposited on the substrate 1800. The dielectric layer or film 1810 is initially deposited on the substrate 1800 to provide for isolation between the substrate 1800 and the conductive seed material 1820 and the first portion 2210 of the first electrode. The conductive seed layer material 1820 is then deposited onto the dielectric layer 1810. The seed layer is patterned so that it is of the appropriate size to receive a piezoelectric material for an FBAR device. A metal layer is deposited and patterned to form the first portion 2210 of a first electrode. The first portion 2210 of the first electrode may be termed as a buried metal trace which will be used to form electrical contact with a second portion of the first electrode. It should be noted that the metal layer that is used to form the first portion 2210 of the first electrode could be of the same material as the seed layer 1820. The first portion 2210 of the first electrode includes a pad 2216 and a an electrical trace 2214.

Figure 19A:
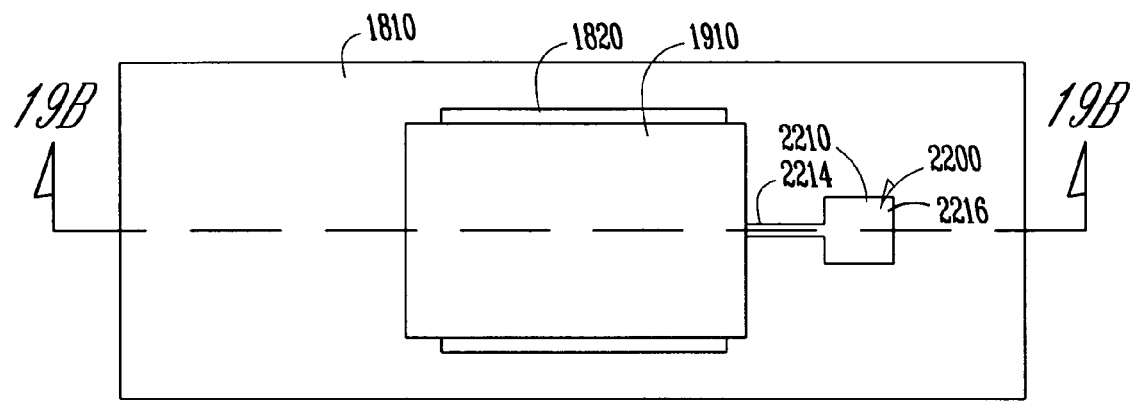
FIG. 19A illustrates a substrate after a piezoelectric film has been deposited thereon.
Figure 19B:
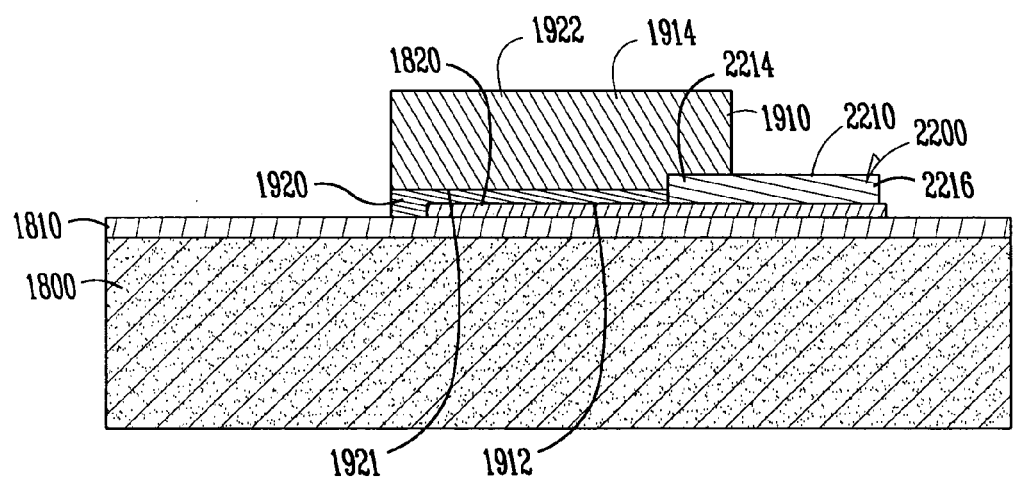
FIG. 19B illustrates a side view of a substrate shown in FIG. 19A.

FIGS. 19A and 19B show top and side views, respectively, of the substrate 1800 after a piezoelectric film 1910 has been deposited thereon. The piezoelectric material 1910 is deposited and patterned. The deposited film 1910 includes a portion which has poor texture 1920 and a portion that has C-axis oriented texture 1922. The poor texture portion of the piezoelectric material is non C-axis oriented. The deposited film of poor texture is generally the initial layers comprising approximately 0.05 microinches. A line, carrying the reference numeral 1921 is shown in FIG. 19B and depicts the transition between the portion of the deposited piezoelectric film having poor texture 1920 and the portion of the piezoelectric film having C-axis oriented texture 1922.

Figure 20A:
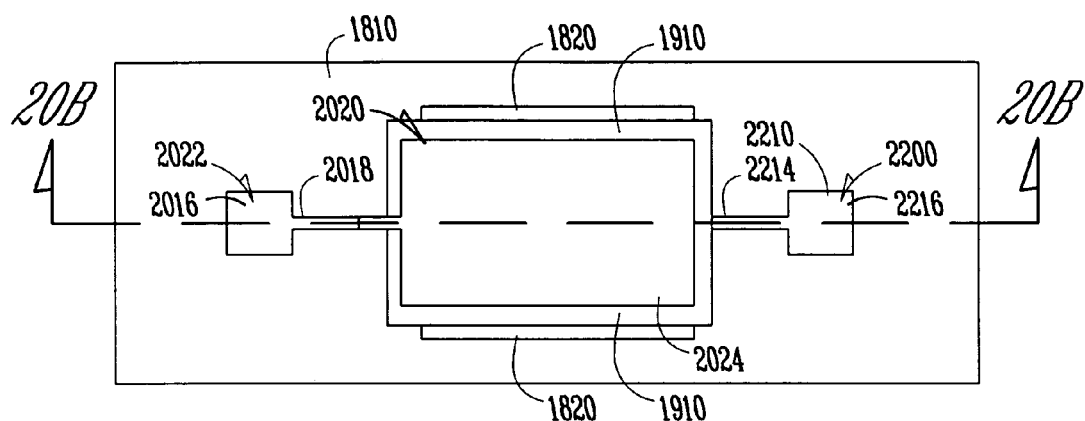
FIG. 20A illustrates a substrate after a second electrode has been deposited on the piezoelectric film and after a portion of the substrate has been removed from the back side of the substrate.
Figure 20B:
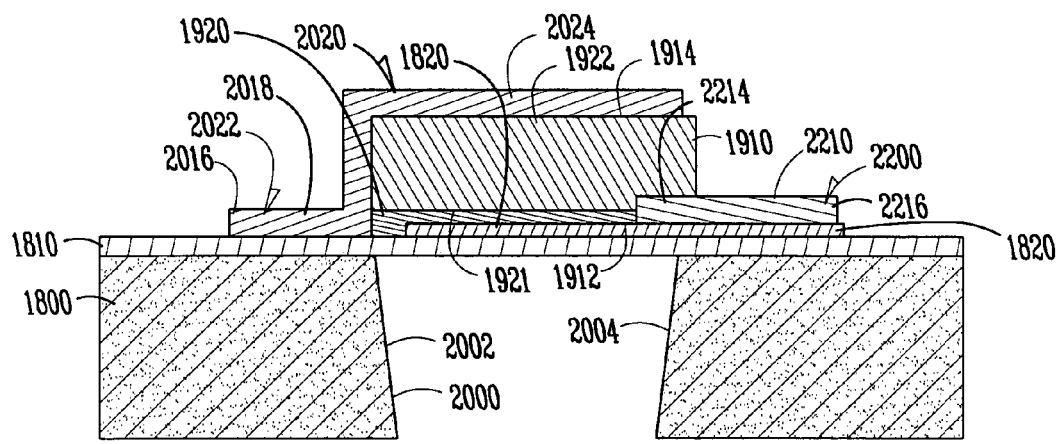
FIG. 20B illustrates a side view of a substrate shown in FIG. 20A.

FIGS. 20A and 20B show top and side views, respectively after a second electrode 2020 has been deposited upon the piezoelectric film 1910 and after a portion of the substrate 1800 has been removed from the back side surface of the substrate 1800. Initially, the second electrode 2020 is deposited and patterned. The second electrode 2020 can also be termed as the top electrode in the FBAR device. The second electrode 2020 includes a first portion 2022 and a second portion 2024. The second portion 2024 substantially covers the surface 1914 of the piezoelectric film 1910. The first portion 2022 of the second electrode 2020 includes a contact pad 2016 and a trace 2018 that connects the contact pad 2016 and the second portion 2024 of the second electrode 2020. The substrate material underneath the piezoelectric film 1910 is removed by deep-trench reactive-ion etching (DRIE). The removal of the portion of the substrate 1800 produces an opening 2000 having sidewalls 2002 and 2004. The etched profile of the DRIE is adjusted to be negative. The opening 2000 can also be termed as a DRIE etch window. Only silicon or the substrate material 1800 is removed. Therefore, the opening or DRIE etch window 2000 is bounded by sidewalls 2002, 2004 and the dielectric layer 1810.

Figure 21A:
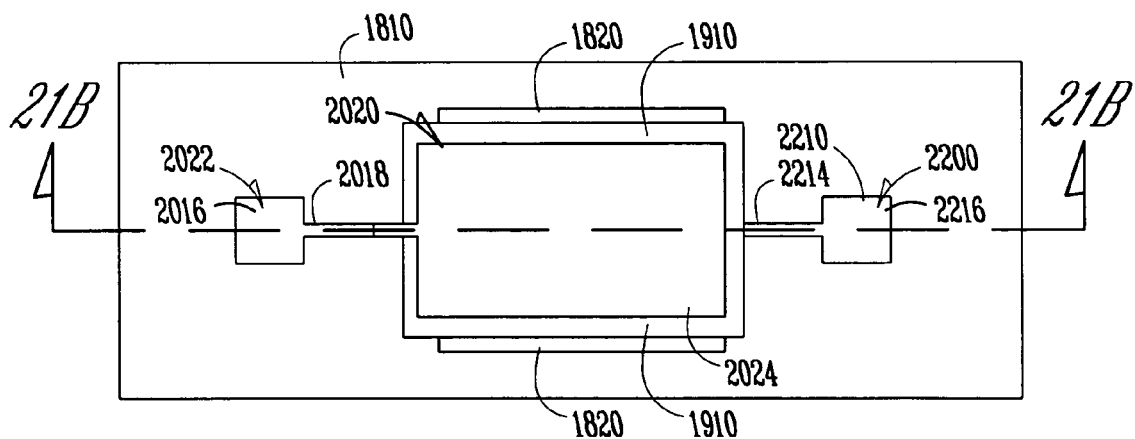
FIG. 21A illustrates a substrate after a portion of the substrate, and a portion of the dielectric layer, a portion of the seed layer beneath the piezoelectric material, and the poorly oriented piezoelectric material have been removed.
Figure 21B:
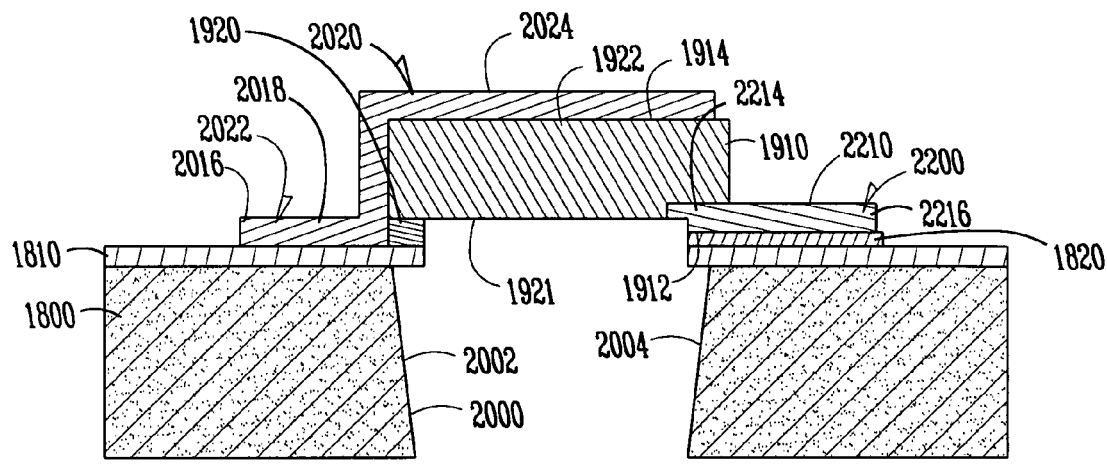
FIG. 21B illustrates a side view of a substrate shown in FIG. 21A.

FIGS. 21A and 21B illustrate the substrate after a portion of the substrate 1800, a portion of the dielectric layer 1810, a portion of the seed layer 1820 and the poorly oriented piezoelectric material 1920 have been removed. The portion of the dielectric material 1810, a portion of the metal seed layer 1820 and the poorly oriented piezoelectric layer 1920 are etched from the back side of the substrate 1800 through the previously etched DRIE window or opening 2000. The etch is self aligned. The etching of the seed layer 1820 can effectively stop on the piezoelectric layer 1910 by end point detection. The etching of the poorly oriented piezoelectric films or film 1920 is based on time control. After the poorly oriented piezoelectric film or films 1920 have been removed, only C-axis oriented film 1922 remains as part of the piezoelectric film 1910. As a result, the piezoelectric properties of the deposited film 1910 are improved.

Figure 22A:
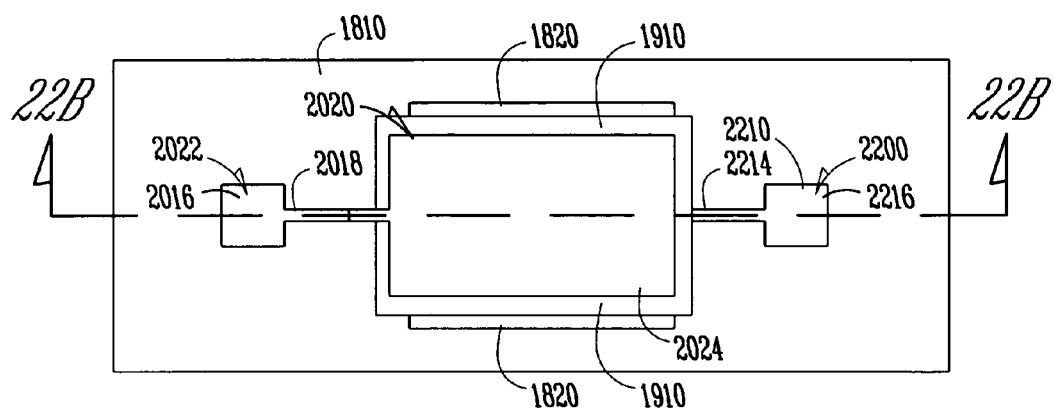
FIG. 22A illustrates a substrate after a second portion of the first electrode is deposited on the piezoelectric layer and on the first portion of the first electrode.
Figure 22B:
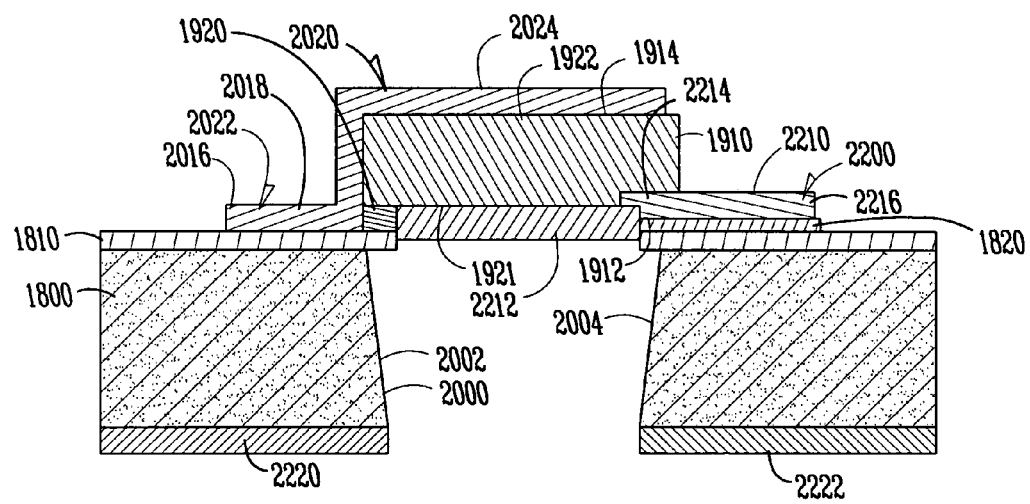
FIG. 22B illustrates a side view of a substrate shown in FIG. 22A.

FIGS. 22A and 22B illustrate top and side views after a second portion 2212 of the first electrode 2200 is deposited along with other metallized portions on the first portion 2210 of the first electrode 2200. Metal is deposited on the back side of the substrate 1800 forming metallized portions 2220, 2222 and the second portion 2212 of the first electrode 2200. Since the etched profile of the DRIE window or opening 2000 was adjusted to be negative in the previous step, metallizing or depositing metal on the back side surface of the substrate 1800 does not result in metal deposits on the sidewalls 2002, 2004 of the opening 2000. The second portion 2212 of the first electrode 2200 is placed in electrical contact with the first portion 2210 of the first electrode 2200. There is an amount of overlap between the first portion 2210 and the second portion 2212 of the first electrode 2200 so as to provide an adequate electrical path between the first and second portions. In this particular embodiment, the overlap is approximately 10 micrometers. The result of this procedure is that a high-quality FBAR device can be formed even though the piezoelectric material or film 1910 is formed on a conductive seed layer 1820. The result of this procedure is that the poor texture film or films of piezoelectric material are removed by back side etching, leaving only C-axis oriented piezoelectric material 1922 as part of the FBAR device.

The structures shown and described in the above figures and the methods discussed for making these structures provides many advantages. Using the inventive method, FBAR devices having a single-crystal piezoelectric film can be obtained. A further advantage is that any seed film can be used, rather than being forced to use the conductive metal material for the bottom or first electrode. The seed material can be selected to produce a piezoelectric film having a particular quality or qualities. In addition, even if the initial layer of a piezoelectric film has undesirable qualities, it can be removed to form an FBAR having high-Q and low insertion loss. The result is an FBAR that has good performance qualities when used in high frequency applications.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A film bulk acoustic resonator device formed on a substrate having an opening therein, the film bulk acoustic resonator comprising:
    a seed layer of non conductive material; and
    a layer of piezoelectric material contacting the seed layer of non-conductive material, wherein the opening extends through the substrate and the seed layer.

2. A film bulk acoustic resonator device formed on a substrate having an opening therein, the film bulk acoustic resonator comprising:
    a seed layer of non conductive material; and
    a layer of piezoelectric material contacting the seed layer of non-conductive material, wherein the seed layer also has an opening therein that corresponds to the opening in the substrate, the opening in the seed layer including a layer of conductive material.

3. The film bulk acoustic resonator of claim 2 wherein the conductive material within the opening in the seed layer is a portion of a first electrode associated with a first surface of the layer of piezoelectric material.

4. The film bulk acoustic resonator of claim 3 further comprising a second electrode associated with a second surface of the layer of piezoelectric material.

5. The film bulk acoustic resonator of claim 4 further comprising a source of RF voltage attached between the first electrode and the second electrode.

6. A film bulk acoustic resonator device formed on a substrate having an opening therein, the film bulk acoustic resonator comprising:
    a seed layer; and
    a layer of piezoelectric material contacting the seed layer of non-conductive material, wherein the opening extends through the substrate and through at least a portion of the seed layer.

7. A film bulk acoustic resonator device formed on a substrate having an opening therein, the film bulk acoustic resonator comprising:
    a seed layer; and
    a layer of piezoelectric material contacting the seed layer of non-conductive material, wherein the seed layer also has an opening therein that corresponds to the opening in the substrate, the opening in the seed layer including a portion of conductive material.

8. The film bulk acoustic resonator of claim 7 wherein the portion of conductive material within the opening in the seed layer is a portion of a first electrode associated with a first surface of the layer of piezoelectric material.

9. The film bulk acoustic resonator of claim 8 further comprising a second electrode associated with a second surface of the layer of piezoelectric material.

10. The film bulk acoustic resonator of claim 9 further comprising a source of RF voltage attached between the first electrode and the second electrode.

11. The film bulk acoustic resonator of claim 6 wherein the seed layer is a single crystal seed layer.

12. The film bulk acoustic resonator of claim 6 further comprising a dielectric layer contacting the seed layer.

13. The film bulk acoustic resonator of claim 12 wherein dielectric layer contacts a first electrical contact and a second electrical contact.

14. The film bulk acoustic resonator device of claim 1 wherein the layer of piezoelectric material further comprises:
    a first surface proximate the substrate; and
    a second surface distal from the surface of the substrate.

15. The film bulk acoustic resonator device of claim 14 further comprising:
    a first conductive layer including a portion in contact with the first surface of the layer of piezoelectric material, the first conductive layer being nonplanar; and
    a second conductive layer in contact with the second surface of the layer of piezoelectric material.

16. The film bulk acoustic resonator device of claim 15 wherein the first conductive layer and the second conductive layer are deposited on the first surface and second surface of the layer of piezoelectric material.

17. The film bulk acoustic resonator device of claim 14 wherein the layer of piezoelectric material is a single-crystal film.

18. The film bulk acoustic resonator device of claim 17 wherein the layer of piezoelectric material is AlN.

19. The film bulk acoustic resonator device of claim 17 wherein the layer of piezoelectric material is ZnO.

20. The film bulk acoustic resonator device of claim 17 wherein the layer of piezoelectric material is a C-axis orientated film.

21. The film bulk acoustic resonator device of claim 14 wherein the layer of piezoelectric material includes:
    a C-axis oriented portion; and
    a non C-axis oriented portion, wherein at least a portion of the first conductive layer and a portion of the second conductive layer is proximate the C-axis oriented portion of the layer of piezoelectric material.

22. The film bulk acoustic resonator device of claim 15 wherein the first conductive layer includes:
    a first planar portion; and
    a second planar portion, the first planar portion and the second planar portion having surfaces in different planes.

23. The film bulk acoustic resonator device of claim 13 the film bulk acoustic resonator positioned over the opening in the substrate.

* * * * *